(12) United States Patent
Lee

(10) Patent No.: US 11,832,422 B2
(45) Date of Patent: Nov. 28, 2023

(54) COMPUTING RACK APPARATUS USING COOLING UNIT

(71) Applicant: Sung Kyun Lee, Yongin-si (KR)

(72) Inventor: Sung Kyun Lee, Yongin-si (KR)

( * ) Notice: Subject to any disclaimer, the term of this patent is extended or adjusted under 35 U.S.C. 154(b) by 0 days.

(21) Appl. No.: 17/944,878

(22) Filed: Sep. 14, 2022

(65) Prior Publication Data

US 2023/0007814 A1   Jan. 5, 2023

Related U.S. Application Data

(62) Division of application No. 16/633,545, filed as application No. PCT/KR2018/008003 on Jul. 16, 2018, now abandoned.

(51) Int. Cl.
*H05K 7/20* (2006.01)

(52) U.S. Cl.
CPC ..... *H05K 7/20736* (2013.01); *H05K 7/20145* (2013.01)

(58) Field of Classification Search
CPC ........... H05K 7/20736; H05K 7/20145; H05K 7/20754; H05K 7/20809; H05K 7/20309; H05K 7/20727
USPC .................................... 361/679.49
See application file for complete search history.

(56) References Cited

U.S. PATENT DOCUMENTS

| | | | |
|---|---|---|---|
| 7,318,322 B2 | 1/2008 | Ota et al. | |
| 2009/0120622 A1 | 5/2009 | Koch | |
| 2012/0268877 A1* | 10/2012 | Rice | H05K 7/20736 |
| | | | 165/104.21 |
| 2015/0237768 A1* | 8/2015 | Endo | H05K 7/20754 |
| | | | 361/679.49 |
| 2017/0064875 A1* | 3/2017 | Casey | H05K 7/20736 |
| 2017/0079163 A1* | 3/2017 | Altizer | H05K 7/20736 |
| 2017/0105317 A1 | 4/2017 | Heydari et al. | |
| 2017/0280593 A1* | 9/2017 | Magallanes | H05K 7/20818 |
| 2017/0325354 A1 | 11/2017 | Lee | |

FOREIGN PATENT DOCUMENTS

| | | |
|---|---|---|
| JP | 2004-063755 A | 2/2004 |
| JP | 2006-138519 A | 6/2006 |
| JP | 2008-084916 A | 4/2008 |
| JP | 2008-171078 A | 7/2008 |
| JP | 2010-238805 A | 10/2010 |
| JP | 2004-246649 A | 11/2012 |

(Continued)

*Primary Examiner* — Stephen S Sul
*Assistant Examiner* — Zhengfu J Feng
(74) *Attorney, Agent, or Firm* — Maschoff Brennan

(57) ABSTRACT

A computing rack apparatus which reduces the manufacturing cost by simplifying the structure thereof and in which the temperature of the internal air is utilized in the cooling unit is disclosed. The apparatus comprises: a rack housing which houses a server, a rack frame which is disposed inside the rack housing and on which the server is fastened and mounted; and a cooling unit which has a discharge port which is disposed inside the rack housing and discharges cooling air and a suction port which sucks the internal air through a cooling zone, wherein the discharge port is located in a first region with respect to a boundary portion defined by a front surface of the server, and the suction port is located in a second region with respect to the boundary portion, and the first and second regions form the cooling zone.

5 Claims, 5 Drawing Sheets

(56) References Cited

FOREIGN PATENT DOCUMENTS

| | | |
|---|---|---|
| JP | 2015-191959 A | 11/2015 |
| KR | 10-2012-0072880 A | 7/2012 |
| KR | 10-1371278 B1 | 3/2014 |
| KR | 10-1547869 B1 | 8/2015 |
| KR | 10-2016-0046347 A | 4/2016 |
| KR | 10-1718414 B1 | 3/2017 |
| WO | 2013/168886 A1 | 11/2013 |

* cited by examiner

COMPUTING RACK APPARATUS USING COOLING UNIT

TECHNICAL FIELD

The present disclosure relates to a computing rack apparatus, and more particularly, to a computing rack apparatus using a cooling unit configured to cool the inside of a rack housing for mounting a server.

BACKGROUND ART

In recent years, the computing rack approach has become mainstream in configuration, storage, and installation of information processing devices such as servers. The computing rack approach is to store devices having their own functions, such as, for example, servers, in layers in a computing rack designed according to a specific standard. As the rack apparatus provides flexibility in terms of selection and arrangement of individual devices, the apparatus may have excellent flexibility and expandability in configuration and may occupy a small area. Regarding servers, 19-inch computing racks specified in standards such as International Electrical Commission (IEC) and Electrical Industries Association (EIA) are mainstream racks. For the 19-inch computing rack, the lateral width of a rack frame for mounting a server is defined in units of 451 mm, and the height in the mounted state is defined. in units of 1U (1 EIA)=44.45 mm.

A computing rack apparatus is required to have a cooling function to effectively remove heat generated from the server. Regarding the cooling technology of the computing rack apparatus, Japanese Patent Application Publication No. 2004-246649 discloses a cooling structure for cooling with a liquid, and Japanese Patent Application Publication No. 2004-063755 discloses a method of using cold air blown by an air conditioning unit. Computing rack apparatuses having a conventional cooling structure as disclosed in the aforementioned patent documents increase manufacturing costs because the cooling structure is complicated, and an external device needs to be configured separately.

In order to address such issues a method of using a cooling unit for cooling the internal air has been proposed in Korean Patent No. 10-1718414. This patent document discloses a separation plate configured to separate a cooling zone and a cooling unit, and a structure of a suction container. In addition, although not explicitly disclosed in the aforementioned patent document, a controller to control a computing rack apparatus is usually disposed on an upper side, and is arranged in a separate case. Since the computing rack apparatus according to the aforementioned patent document requires a separator plate, a suction container, case for the controller, etc., the structure thereof is excessively complicated, which increases manufacturing costs. Further, the separation plate prevents the temperature of the internal air from being properly utilized in the cooling unit, resulting in heat loss.

DISCLOSURE

Technical Problem

Therefore, the present disclosure has been made in view of the above problems, and is one object of the present disclosure to provide a computing rack apparatus to simplify a structure to reduce manufacturing costs and enable the temperature of internal air to be utilized in a cooling unit.

Technical Solution

In accordance with one aspect of the present disclosure, provided is a computing rack apparatus including a rack housing configured to store a server; a rack frame disposed in the rack housing, the server being fastened to and mounted on the rack frame; and a cooling unit disposed in the rack housing, the cooling unit including a discharge port configured to discharge cooling air and a suction port configured to suck internal air passing through a cooling zone. Herein, the discharge port is located in a first region with respect to a boundary defined as a front surface of the server, and the suction port is located in a second region with respect to the boundary, the first and second regions forming the cooling zone.

In the apparatus of the present disclosure, a space between the server and the cooling unit may be opened to form an open structure. The cooling air discharged through the discharge port may flow along the discharge port, the cooling zone, and the suction port. The cooling air discharged from the discharge port may flow toward a server above the cooling unit or toward a server below the cooling unit. The cooling unit may be fixed to the rack frame. The cooling unit may include any one cooling means selected from an evaporator, an air-cooled total heat exchanger, a water-cooled heat exchanger, or a combination thereof.

In the apparatus of the present disclosure, the cooling unit may include a third region containing a cooling means and a fourth region allowing external air to flow therethrough, the third region and the fourth region being divided by a partition. The fourth region may include at least one of a suction duct communicating with an air suction passage allowing the external air to be sucked therethrough and a discharge duct communicating with an air discharge passage allowing the external air to be discharged therethrough. The rack housing may include at least one of a plurality of suction vent holes formed in a front door and connected to the suction duct and a plurality of discharge vent holes formed in a rear door and connected to the discharge duct.

In the apparatus of the present disclosure, the third region may contain a reservoir to store moisture. The reservoir may include a water level sensor and a heater. A controller may be mounted in the third region.

In the apparatus of the present disclosure, the cooling unit may include a third region containing a cooling means and a fourth region separated from the third region by a partition, wherein the fourth region may include at least one of an air suction passage allowing the external air to be sucked therethrough and an air discharge passage allowing the external air to be discharged therethrough, the at least one of the air suction passage and the air discharge passage being disposed on a bottom of the cooling unit.

Advantageous Effects

According to the computing rack apparatus using cooling unit of the present disclosure, by setting the position where the cooling air cooled by the cooling unit is discharged to the space in front of a server, the structure may be simplified, the manufacturing cost may be reduced, and the temperature of the internal air may be utilized in the cooling unit. In addition, the cooling unit may include an evaporator, and the space containing the compressor may be blocked from the space where the evaporator is located by using a means for suction and discharge of air.

BEST MODE

Figure 1:
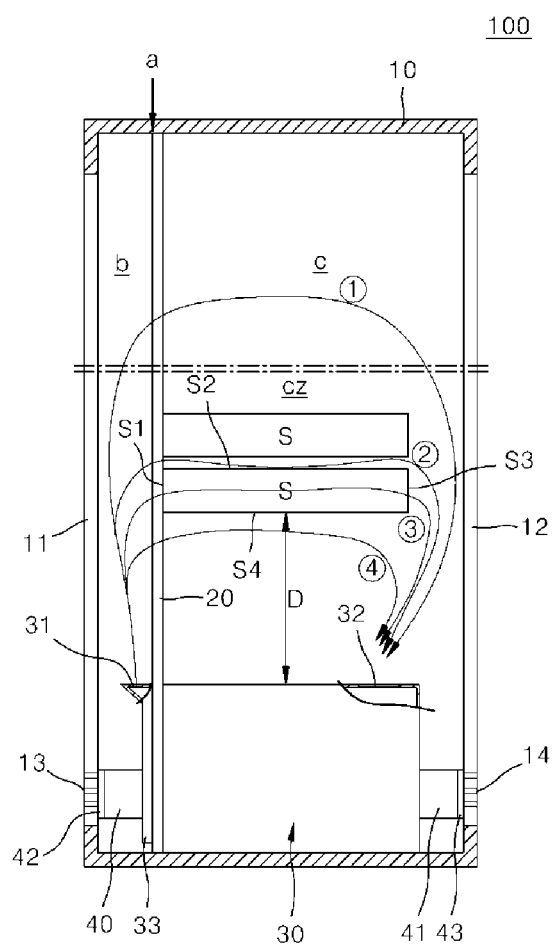
FIG. 1 is a view schematically illustrating a first computing rack apparatus using a cooling unit according to the present disclosure.

Hereinafter, exemplary embodiments of the present disclosure will be described in detail with reference to the accompanying drawings. The embodiments described below may be modified in various other forms, and the scope of the present disclosure is not limited to the embodiments described below. The embodiments of the present disclosure are provided to more completely explain the present disclosure to those skilled in the art. Terms indicating location, such as top, bottom, front, etc., are only related to those shown in the drawings. In practice, the computing rack apparatus may be used in any optional direction. In actual use, the spatial direction changes with the direction and rotation of the computing rack apparatus.

An embodiment of the present disclosure provides a computing rack apparatus simplifying the structure thereof by setting the position where cooling air cooled by the cooling unit is discharged to the space in front of the server to reduce manufacturing costs and utilize the temperature of internal air in the cooling unit. In this regard, the structure of a cooling unit in which the discharge position of the cooling air is adjusted, the structure of a computing rack apparatus using the same, and the operations of the computing rack apparatus will be described in detail. In addition, elements added to the computing rack apparatus according to an embodiment of the present disclosure to more efficiently perform the operation of the computing rack apparatus will be described in detail.

FIG. 1 is a view schematically illustrating a first computing rack apparatus 100 using a cooling unit according to an embodiment of the present disclosure.

Referring to FIG. 1, the first device 100 of the present disclosure includes a rack housing 10, in which a server S is accommodated. A rack frame 20, which may be positioned perpendicular to the ground, is provided in the rack housing 10. In the rack frame 20, computer equipment such as the server S is installed by fastening bolts or the like, and constitutes a standard rack defined by international standards (IEC, EIA, and DIN) for 19 inches or 23 inches. The rack housing 10 provides a rectangular parallelepiped interior space and defines the exterior of the computing rack apparatus of the present disclosure. In the rack housing 10, a cooling zone CZ in which cooling is caused by a first cooling unit 30 is formed. The rack housing 10 is provided with a front door 11 and a rear door 12, which rotate around hinge axes. The doors 11 and 12 may be formed of a transparent material, such as, for example, glass, such that the interior may be visually checked.

Although not shown in the figure, each of the doors 11 and 12 and the rack housing 10 includes a locking device. Various kinds of locks may be employed as the locking device. An electromagnetic lock operated by electromagnetic force may be used. In addition, each of the doors 11 and 12 may be provided with a plunger. The doors 11, 12 may be opened based on, for example, a password or a threshold temperature. Furthermore, a door sensor is mounted on the rack housing 10 to stop the operation of the first cooling unit 30 when the doors 11 and 12 are opened. For the locking device, the plunger and the door sensor, well-known techniques may be used. In addition, components not disclosed herein may be mounted in order to operate the computing rack apparatus more efficiently within the scope of the present disclosure.

The first cooling unit 30, which includes a discharge port 31 and a suction port 32, is positioned in the lower and middle portions of the rack housing 10. In the figure, the first cooling unit 30 is illustrated as being positioned in the lower portion. The first cooling unit 30 is fixed to the rack frame 20 by a fixing flange 33. In other words, not only the server S but also the first cooling unit 30 is fixed to the rack frame 20. The server includes a server front surface S1, a server top surface S2, a server rear surface S3, and a server bottom surface S4. The server S is fixed by a portion of the server front surface S1. The first cooling unit 30 generates cooled cooling air and sends the same to the cooling zone CZ through the discharge port 31. For simplicity, the air discharged through the discharge port 31 is referred to as cooling air, the air flowing through the cooling zone CZ is referred to as internal air, and the air sucked into the suction port 32 is called suction air.

The cooling zone CZ is divided into a first region b and a second region c by a boundary a, which is defined by the server front surface S1. Since the server front surface S1 is substantially mounted on the rack frame 20, the boundary a may be regarded as the rack frame 20. Here, the boundary a is not clearly distinguished like a line, but is conceptually divided based on the discharge port 31 and the suction port 32. Accordingly, the boundary a may be defined as either the front surface S1 of the server or the rack frame 20 within the scope of the present disclosure. In this specification, the boundary a is set as the front surface S1 of the server for convenience of description. That is, the space on the left side of the server front surface S1 is the first area b and the space on the right side is the second area c.

The internal air passing through the discharge port 31 returns to the suction port 32 via a path ① above the server S, a path ② between the servers S, a path ③ inside the server S, and a path ④ below the server S. The server S is cooled by the internal air passing through the paths ①, ②, ③ and ④. Substantially, in cooling the server S, cooling by the path ③ inside the server is the main mechanism. Specifically, the server S sucks the cooling air present in the first region b through the front surface S1. The sucked air cools down components such as a CPU, a memory, and a power supply inside the server S, and then the internal air is discharged through the rear surface S3. The internal air is warmed by absorbing heat from the server S, the warmed internal air is sucked into the suction port 32. The suction air introduced through the suction port 32 is cooled again in the first cooling unit 30.

The first region b includes the discharge port 31 and the second region c includes the suction port 32. In the second region c, the internal air that has been warmed by cooling the server S is sucked into the suction port 32. In other words, the cooling air having passed through the first region b cools the cooling zone CZ including the server S in the second region c. When the server S is located above the discharge port 31 as in Korean Patent No. 10-1718414, it is difficult to smoothly form the paths ①, ②, ③, and ④ described above. This is because the discharge port 31 faces the bottom surface S4 of the server, and the cooling air collides with the bottom surface S4 of the server. Accordingly, the discharge port 31 is formed to protrude into the space between the front surface S1 and the front door 11 of the server fastened to the rack frame 20. The shortest distance D between the first cooling unit 30 and the server S is determined in consideration of the flow according to fluid mechanics, the amount of the internal air, the flow rate, and the like.

A cooling means is provided in the first cooling unit 30. Any cooling means may be adopted as long as it is capable of cooling the suction air sucked from the cooling zone CZ. For example, the cooling means may be an evaporator, an air-cooled total heat exchanger, a water-cooled heat exchanger, or a combination thereof. The evaporator is a device configured to absorb heat by evaporation by introducing a low-temperature and low-pressure refrigerant obtained through an expansion valve. The air-cooled total heat exchanger is a device that causes heat exchange to occur between hot air and cold air. The water-cooled heat exchanger is a device that causes heat exchange to occur between suction air and a cold liquid.

The combination is a combination of different cooling means, such as a combination of the evaporator and the air-cooled heat exchanger, a combination of the evaporator and the water-cooled heat exchanger, or a combination of the air-cooled heat exchanger and the water-cooled heat exchanger. The cooling means may include a plurality of evaporators, air-cooled heat exchangers, or water-cooled heat exchangers. For example, several evaporators may be installed. Further, any one of the plurality of evaporators, the plurality of air-cooled heat exchangers, and the plurality of water-cooled heat exchangers may be combined with any one of one evaporator, one air-cooled total heat exchanger, and one water-cooled heat exchanger. For example, the plurality of air-cooled total heat exchangers may be combined with one evaporator.

Figure 2:
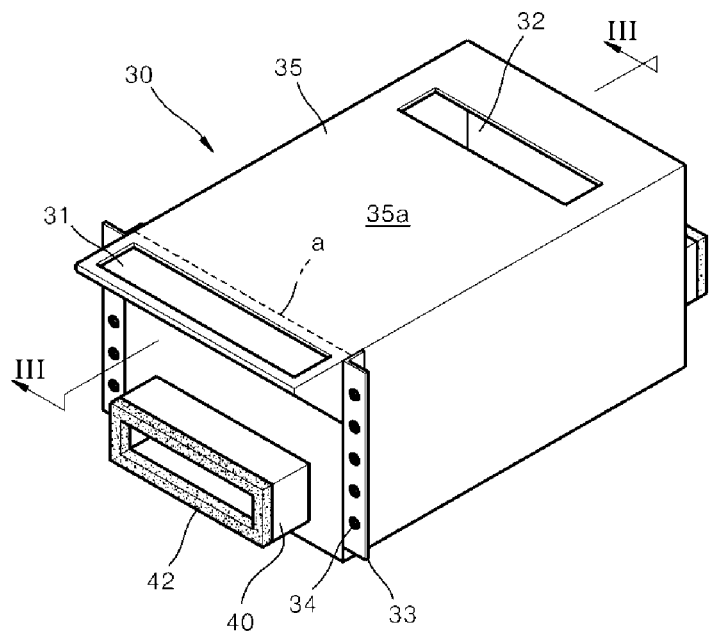
FIG. 2 is a perspective view illustrating a first cooling unit according to the present disclosure.
Figure 3:
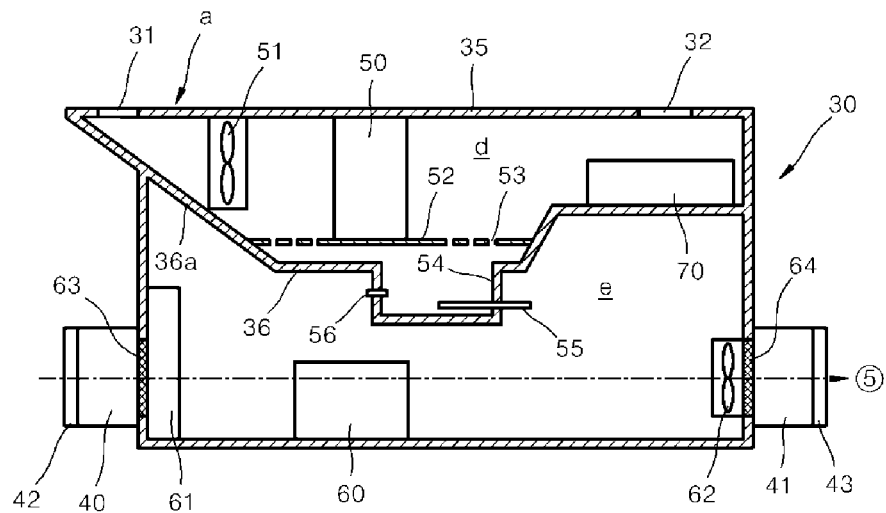
FIG. 3 is a cross-sectional view taken along line III-III of FIG. 2.

Optionally, a suction duct 40 for sucking external air may be provided between the first cooling unit 30 and the front door 11, and a discharge duct 41 for discharging the external air to the outside may be provided between the first cooling unit 30 and the rear door 12. Here, the term "between" means that at least one of the suction duct 40 and the discharge duct 41 is attached to the front or rear door 11, 12, or is attached to the first cooling unit 30. To this end, a plurality of suction vent holes 13 and a plurality of discharge vent holes 14 are provided in the front door 11 and the rear door 12. That is, external air sucked through the suction vent holes 13 and the suction duct 40 passes through the first cooling unit 30, and is then discharged from the rack housing 10 through the discharge duct 41 and the discharge vent holes 14. The external air, which will be described later with reference to FIGS. 2 and 3, is distinguished from air cooled by the cooling means.

A suction packing 42 and a discharge packing 43 for sealing may be provided between the suction duct 40 and the front door 11 and between the discharge duct 41 and the rear door 12, respectively. External air flowing through the suction duct 40 and the discharge duct 41 is prevented from leaking into the cooling zone CZ by the suction packing 42 and the discharge packing 43. In the case where the external air flows into the cooling zone CZ, temperature control of the cooling zone CZ becomes difficult. The suction packing 42 and the discharge packing 43 may be placed between the suction duct 40 and the first cooling unit 30 and between the first cooling unit 30 and the discharge duct 41, respectively. That is, the suction packing 42 and the discharge packing 43 may be disposed on either or both sides of one or more of the suction duct 40 and the discharge duct 41.

In the computing rack device according to the embodiment of the present disclosure, the space (see D) containing the first cooling unit 30 and the server S is open without being separated. Accordingly, a separation structure for separating the space containing the first cooling unit 30 and the server S is not necessary. Korean Patent No. 10-1718414 discloses a separation plate as the separation structure. In addition, since the first cooling unit 30 is exposed to the cooling zone CZ, the air of the cooling zone CZ is directly transferred to the first cooling unit 30 to additionally cool the first cooling unit 30. That is, the temperature of the internal air in the cooling zone CZ is utilized in cooling the first cooling unit 30. Accordingly, energy required to cool the suction air may be reduced.

Hereinafter, an example of applying an evaporator as the cooling means will be described. The evaporator has a relatively large cooling effect and a relatively simple structure compared to other cooling means, and is suitable as a cooling means for the computing rack apparatus of the present disclosure.

FIG. 2 is a perspective view illustrating the first cooling unit 30 according to an embodiment of the present disclosure, and FIG. 3 is a cross-sectional view taken along line III-III of FIG. 2. The overall structure of the first computing rack apparatus 100 of the present disclosure is shown in FIG. 1. The suction duct 40, the discharge duct 41, the suction packing 42 and the discharge packing 43 are illustrated in detail in FIG. 1.

Referring to FIGS. 2 and 3, the first cooling unit 30 includes a case 35 in which a cooling means including an evaporator 50 is arranged. The case 35 may be a box having a rectangular parallelepiped shape. The first cooling unit 30 is fixed to the rack frame 20 by the fixing hole 34 of the fixing flange 33. Of course, the first cooling unit 30 may be fixed to the rack frame 20 at the bottom or the middle of the rack housing 10. The discharge port 31 and the suction port 32 described above may be present in a surface 35a of the case 35 facing the server S. That is, the discharge port 31 and the suction port 32 are disposed on one of the surfaces forming the case 35. In the figure, the top surface of the case 35 is the same as the surface 35a facing the server S.

Of course, the suction port 32 may be located on a side surface of the case 35 within the scope of the present disclosure. In addition, the suction port 32 may be located at the corner of the case 35. As such, the position of the suction port 32 is determined in consideration of the flow according to fluid dynamics, the amount of the internal air, the flow rate, and the like. However, the discharge port 31 is preferably located on the surface 35a facing the server S.

The interior of the first cooling unit 30 is divided into a third region d and a fourth region e by a first partition 36. In the third region d, the evaporator 50 is located, and the fourth region e contains a compressor 60 and a condenser 61 configured to operate the evaporator 50. In an extended concept of this configuration, the third region d is where the cooling means is placed, and the fourth region d is an area which is additionally provided to assist the cooling means in cooling. In some cases, when the space for assisting the cooling means in cooling is not necessary, only the third region d may be provided without the fourth region e. In this case, the first partition 36 may be thermally insulated.

In the third region d, the evaporator 50 for cooling the suction air sucked from the suction port 32 is positioned. The evaporator 50 is placed on a support plate 52. The support plate 52 has a plurality of through holes 53 to suck moisture formed in the third region d and send the sucked moisture to a reservoir 54. The cooling air passing through the evaporator 50 is sent to the discharge port 31 by a discharge fan 51. The discharge fan 51 may be a Sirocco fan or a crossing fan. The first partition 36 facing the discharge port 31 is inclined to direct the flow of the cooling air toward the first region b in an upward direction. In other words, the inclined portion 36a of the partition serves to direct the cooling air toward the cooling zone CZ.

The reservoir 54 is provided with a water level sensor 56 and a heater 55. When it is checked by the water level sensor 56 that a certain amount of water is stored in the reservoir 54, the heater 55 is turned on to heat the water. Here, the heater 55 serves as an electric heater to heat water above an evaporation temperature of the water. When the stored water is heated by the heater 55, the water is evaporated and discharged into the cooling zone CZ through the third region d in the form of water vapor. The cooling zone (CZ) needs a certain degree of humidity in order to prevent static electricity from causing failure of the server S. Water vapor formed by evaporation caused by the heater 55 serves as a humidifier assisting in forming the humidity. When the water level sensor 56 determines that the stored water is insufficient, the heater 55 is turned off to stop heating the water.

A controller 70 is mounted in the third region d. The controller 70 may be a printed circuit board that is provided with necessary components and circuits and is not embedded in a separate case. Since the internal air of the cooling zone CZ maintains an appropriate humidity and temperature, the components and circuits mounted on the printed circuit board are not damaged. Thus, the controller 70 does not need to be mounted in a separate case unlike the related art. Of course, the controller 70 may be protected with a simple cover or the like. Since the cover only needs to be opened, there is no need to disassemble the case and check the controller 70 as in the related art. In addition, when the controller 70 is provided in the third region d, the distance thereof to the evaporator 50, the compressor 60, and the like is short, and therefore electrical connections such as power lines, communication lines, and various signal lines for the components are simplified.

The fourth region e is blocked from the third region d by the first partition 36. A compressor 60, a condenser 61, and a discharge fan 62 are disposed therein. Here, the discharge fan 62 may be a Sirocco fan or a crossing fan, and may serve to cool the condenser 61. Due to the condenser 61 and the compressor 60, the internal temperature of the fourth region e is higher than that of the third region d. Other devices not shown in the figure may be added to the fourth region e. For example, the other devices include an auxiliary reservoir, a liquid separator, and a receiver, which are configured in case of overflowing of the expansion valve, the compressor 60, and the reservoir 54, and an inflow path for introducing external cold air.

External air flows along a path ⑤ extending along the suction duct 40, an air suction passage 63, a discharge fan 62, an air discharge passage 64, and a discharge duct 41. Here, the external air flows into the first cooling unit 30 through the air suction passage 63. The external air flows out of the first cooling unit 30 through the air discharge passage 64. The air suction passage 63 and the air discharge passage 64 may be implemented as one through hole or a plurality of through holes, for example, or may be implemented as a mesh.

The first cooling unit 30 and the bottom surface S4 of the server according to an embodiment of the present disclosure are spaced apart from each other by a distance D to form an empty space. In other words, unlike the related art (Korean Patent No. 10-1718414), the first device 100 of the present disclosure does not require a structure such as a separator plate and a suction container for separating the cooling zone and the cooling unit. Accordingly, the manufacturing cost of the first device 100 may be significantly reduced. A structure having an empty space between the first cooling unit 30 and the bottom surface S4 of the server as described above is called an open structure. In contrast, the conventional structure of Korean Patent No. 10-1718414 is referred to as a closed structure.

Figure 4:
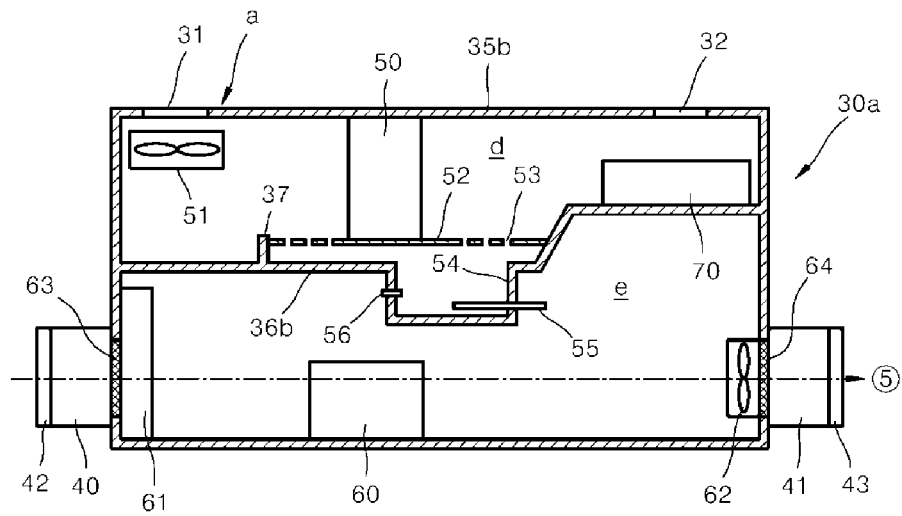
FIG. 4 is a cross-sectional view showing a second cooling unit according to the present disclosure.

FIG. 4 is a cross-sectional view showing a second cooling unit 30a according to an embodiment of the present disclosure. Here, the second cooling unit 30a is the same as the first cooling unit 30 except for the shape thereof near the discharge port 31. In addition, although some of the components constituting the first cooling unit 30 are slightly changed in shape or mounting positions, the same reference numerals are assigned to the same functions and roles. Accordingly, redundant description of the same parts will be omitted. Here, the overall structure of the first computing rack apparatus 100 of the present disclosure is shown in FIG. 1.

Referring to FIG. 4, unlike the first cooling unit 30, the second cooling unit 30a is configured such that the side surface of the discharge port 31 is flat and is not inclined. Accordingly, the suction duct 40 is attached to the flat surface. Since the side surface of the case 35b to which the suction duct 40 is attached is flat, a second partition 36b to separate the third region d and the fourth regions e may be flat or slightly inclined. In addition, the support plate 52 supporting the evaporator 50 is supported by a first fixing part 37. When the case 35b is made flat, the structure of the case 35b may be simplified, and thus manufacturing costs may be reduced. In the case 35b, the lower portion of the second partition 36b may be recessed to have a predetermined width. In this case, the suction duct 40 is disposed deeper in the case 35b than shown in the figure.

Figure 5:
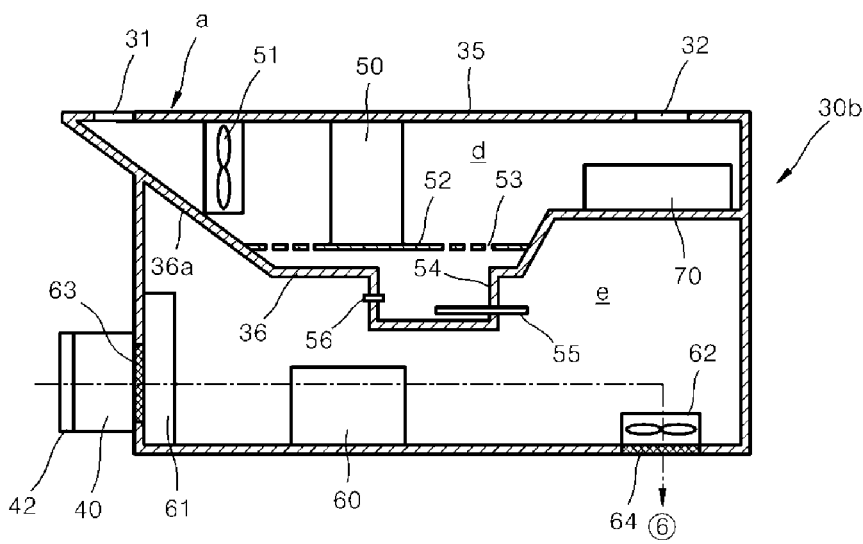
FIG. 5 is a cross-sectional view showing a third cooling unit according to the present disclosure.

FIG. 5 is a cross-sectional view showing a third cooling unit 30b according to an embodiment of the present disclosure. Here, the third cooling unit 30b is the same as the first cooling unit 30 except that an air discharge passage 64 is located at the bottom of the case 35. Thus, detailed description of the same parts will be omitted. Of course, in the third cooling unit 30b, the side surface of the case 35b may be flat like the second cooling unit 30a. Here, the overall structure of the first computing rack apparatus 100 of the present disclosure is shown in FIG. 1.

Referring to FIG. 5, in the third cooling unit 30b, an air discharge passage 64 is disposed at the bottom of the case 35. Here, the bottom is a portion on the other side of the surface 35a facing the server S with the third and fourth regions d and e interposed therebetween. The discharge fan 62 may be located near the air discharge passage 64, but is not limited thereto. The air suction passage 63 communicates with the suction duct 40 as in the first cooling unit 30. That is, external air is discharged toward the ground through the path ⑥ of the suction duct 40, the air suction passage 63, the discharge fan 62, and the air discharge passage 64. Although not shown in the figure, a discharge duct 41 may be installed in a space between the third cooling unit 30b and the rack housing 10, and a discharge packing 43 may be optionally provided. To this end, a discharge vent hole 14 having the same function and role as in FIG. 1 is provided in the rack housing 10.

Figure 6:
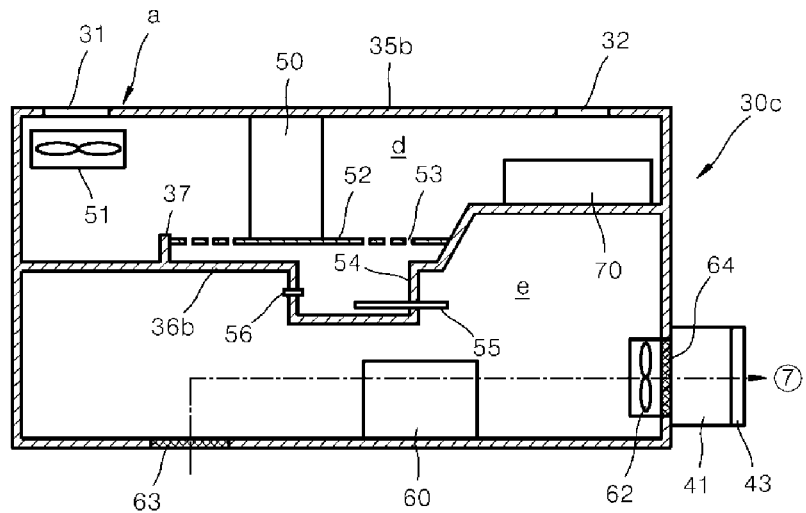
FIG. 6 is a cross-sectional view showing a fourth cooling unit according to the present disclosure.

FIG. 6 is a cross-sectional view showing a fourth cooling unit 30c according to an embodiment of the present disclosure. In this case, the fourth cooling unit 30c is conceptually the same as the second cooling unit 30a except that the air suction passage 63 is located at the bottom of the case 35. Accordingly, redundant description of the same parts will be omitted. Here, the overall structure of the first computing rack apparatus 100 of the present disclosure is shown in FIG. 1.

Referring to FIG. 6, the air suction passage 63 of the fourth cooling unit 30c is located at the bottom of the case 35. The air discharge passage 64 communicates with the discharge duct 41 as in the first cooling unit 30. That is, external air is sucked up from the ground side and discharged to the outside of the rear door 12 through a path ⑦ of the air suction passage 63, the discharge fan 62, the air discharge passage 64, and the discharge duct 41. In this case, the fourth cooling unit 30c does not need to include the suction duct 40 and the suction packing 42 in the first cooling unit 30, and therefore the structure of the first device 100 may be simplified. In this case, the positions of the plurality of suction vent holes 13 in the front door 11 are changed to the bottom of the rack housing 10. Although not shown in the figure, a suction duct 40 may be installed in the space between the fourth cooling unit 30c and the rack housing 10. Optionally, a suction packing 42 may be provided. To this end, a suction vent hole 13 having the same function and role as described in FIG. 1 is provided in the rack housing 10.

Figure 7:
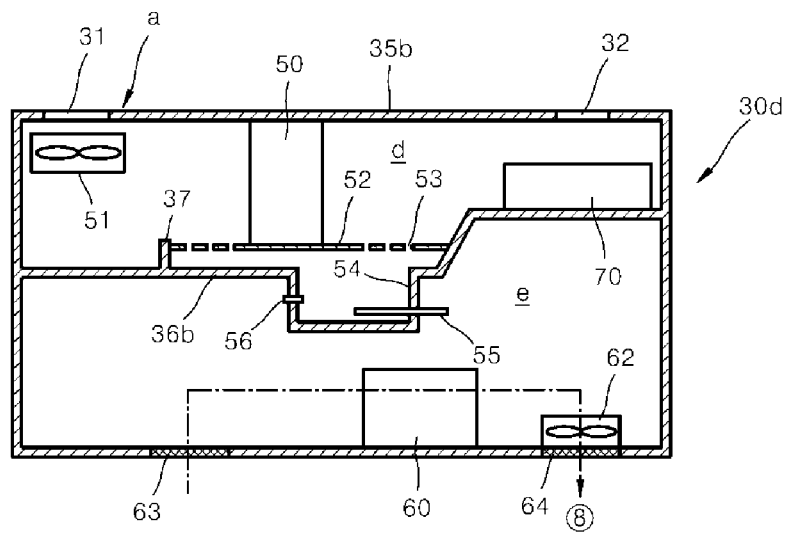
FIG. 7 is a cross-sectional view showing a fifth cooling unit according to the present disclosure.

FIG. 7 is a cross-sectional view showing a fifth cooling unit 30d according to an embodiment of the present disclosure. Here, the fifth cooling unit 30d is similar to the second cooling unit 30a except that the air suction passage 63 and the air discharge passage 64 are located at the bottom of the case 35. Accordingly, detailed description of the same parts will be omitted. Here, the overall structure of the first computing rack apparatus 100 of the present disclosure is shown in FIG. 1.

Referring to FIG. 7, the air suction passage 63 and the air discharge passage 64 of the fifth cooling unit 30d are located at the bottom of the case 35. In this case, external air is sucked up from the ground side and is discharged to the ground side through a path ⑧ of the air suction passage 63, the discharge fan 64 and the air discharge passage 64. In this case, the fifth cooling unit 30d does not need to include the suction duct 40, the suction packing 42, the discharge duct 41, and the discharge packing 43 of the first cooling unit 30, and therefore the structure of the device 100 may be further simplified. Here, the positions of the plurality of suction vent holes 13 and the discharge vent holes 14 in the front door 11 and the rear door 12 are changed to the bottom of the rack housing 10. Although not shown in the figure, at least one of the suction duct 40 and the discharge duct 41 may be installed in the space between the fifth cooling unit 30d and the rack housing 10 in which the air suction passage 63 is located, and the space between the fifth cooling unit 30d and the rack housing 10 in which the air discharge passage 64 is located. In each case, a suction packing 42 or a discharge packing 43 may be provided. To this end, a suction vent hole 13 and a discharge vent hole 14 having the same functions and roles as described in FIG. 1 are provided in the rack housing 10.

Figure 8:
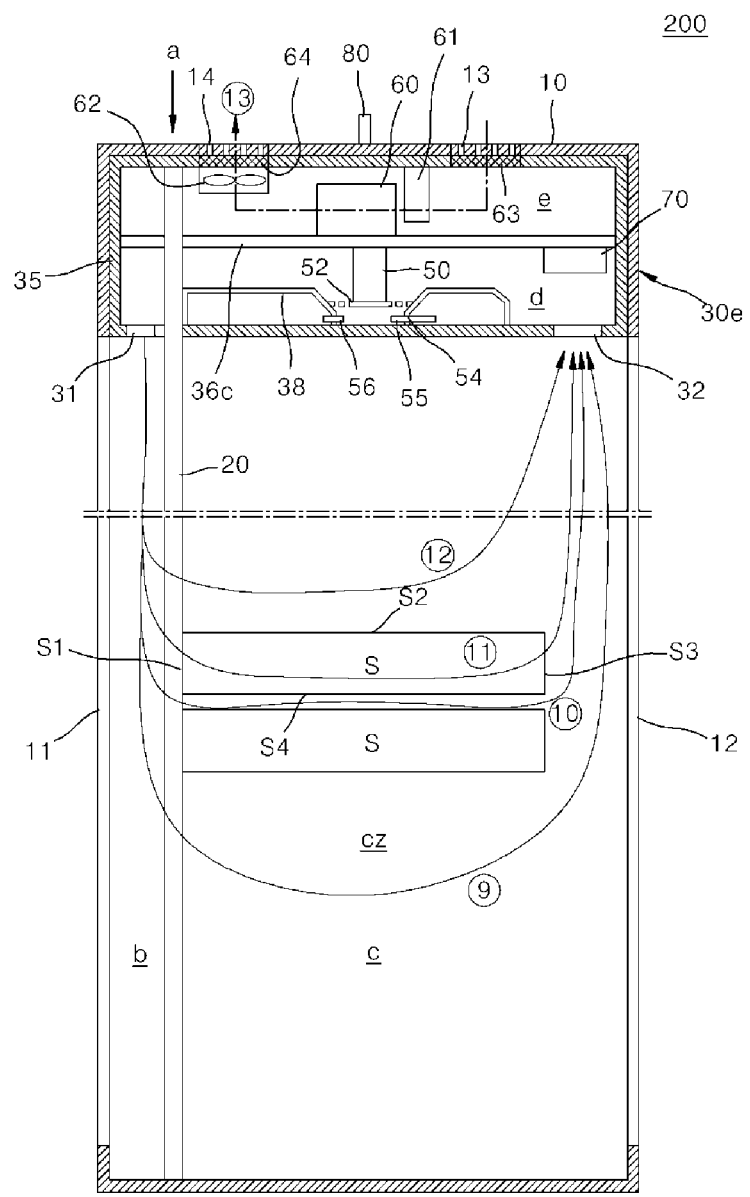
FIG. 8 is a view schematically illustrating a second computing rack apparatus using a cooling unit according to the present disclosure.

FIG. 8 is a view schematically illustrating a second computing rack apparatus 200 using a cooling unit according to an embodiment of the present disclosure. The second apparatus 200 is the same as the first device 100 except that a sixth cooling unit 30e is disposed on the rack housing 10. All of the concepts of the first to fifth cooling units 30, 30a, 30b, 30c, and 30d may be applied to the sixth cooling unit 30e within the scope of the present disclosure. In this embodiment, description will be given based on the concept of the fifth cooling unit 30d.

Referring to FIG. 8, the sixth cooling unit 30e of the second device 200 is disposed over the rack housing 10 above the server S. To this end, the sixth cooling unit 30e is fixed to an upper portion of the rack frame 20. The method of fixing the sixth cooling unit 30e has been described in detail regarding the first apparatus 100. The discharge port 31 and the suction port 32 in the sixth cooling unit 30e face the server S downward, unlike the first device 100. The cooling air passing through the discharge port 31 returns to the suction port 32 via a path ⑨ below the server S, a path ⑩ between the servers S, a path ⑪ inside the server S, and a path ⑪ above the server S. Details of the path ⑨, path ⑩, path ⑪ and path ⑫ are the same as those of the path ①, path ②, path ③ and path ④ of the first apparatus 100.

The third and fourth regions d and e are separated by a third partition 36c. The third and fourth regions d and e of the second device 200 are a vertically inverted structure of the third and fourth regions d and e of the first apparatus 100. The support plate 52 is fixed to a second fixing portion 38, which is formed to surround the reservoir 54. The second fixing portion 38 may be modified in various forms within the scope of the present disclosure. For example, the second fixing portion 38 may be implemented as a structure smaller than that shown in the figure, and may have any size as long as it surrounds the reservoir 54. While it is illustrated in the figure that the sixth cooling unit 30e is inserted into the rack housing 10, the rack housing 10 itself may implement the sixth cooling unit 30e. In this case, a part of the rack housing 10 may be the sixth cooling unit 30e.

In the fourth region e, the air suction passage 63 and the air discharge passage 64 of the sixth cooling unit 30e are located on the ceiling of the case 35. In this case, the external air is discharged to the outside of the ceiling through the path ⑬ of the air suction passage 63, the discharge fan 62, and the air discharge passage 64. Here, the positions of the plurality of suction vent holes 13 and the discharge vent holes 14 in the front door 11 and the rear door 12 are changed to the ceiling of the case 35. A separation wall 80 may be added to the outside of the rack housing 10 to prevent air flows through the suction vent hole 13 and the discharge vent hole 14 from being mixed with each other.

The second apparatus 200 according to the embodiment of the present disclosure is separated into first and second regions b and c based on the boundary a defined by the front surface S1 of the server. The first region b contains a discharge port 31 and the second region c contains a suction port 32. The second region c cools the server S and also sucks warmed internal air through the suction port 32. In other words, the cooling air having passed through the first region b cools the cooling zone CZ containing the server S in the second region c. In addition, an open structure having an empty space between the sixth cooling unit 30e and the top surface S2 of the server is configured.

Although not shown in the figure, at least one of the suction duct 40 and the discharge duct 41 may be installed in the space between the sixth cooling unit 30e and the rack housing 10 in which the air suction passage is located, and the space between the sixth cooling unit 30e and the rack housing 10 in which the air discharge passage 64 is located. In each case, a suction packing 42 or a discharge packing 43 may be provided. To this end, the suction duct 40 and the discharge duct 41 communicate with the suction vent hole 13 and the discharge vent hole 14 of the rack housing 10.

As described above, the suction duct 40 and the discharge duct 41 may be arranged in various ways. First, at least one of the suction duct 40 and the discharge duct 41 may be installed. In addition, the suction duct 40 and the discharge duct 41 may be coupled to the front door 11 and the rear door 12, respectively, as shown in FIGS. 1 to 4, or coupled to the rack housing 10 as shown in FIGS. In some cases, at least one of the suction duct 40 and the discharge duct 41 may be coupled to the first cooling unit 30. Accordingly, the suction duct 40 and the discharge duct 41 may be located between the first cooling unit 30 and the front door 11, the rear door 12 or the rack housing 10, respectively. In other words, the suction duct 40 and the discharge duct 41 may be defined as communicating with the first cooling unit 30 for suction and discharge of external air, respectively.

Although the present disclosure has been described in detail with reference to preferred embodiments, the present disclosure is not limited to the above-described embodiments. It will be apparent to those skilled in the art that various modifications may be made within the scope of the technical idea of the present disclosure. For example, while the first to sixth cooling units are illustrated as including both the third and fourth regions d and e, the third and fourth regions d and e may be separated. The separated third and fourth regions d and e may be appropriately disposed at the upper and lower portions of the rack housing 10, respectively.

LIST OF REFERENCE NUMERALS

10: Rack housing 11: Front door
12: Rear door 13: Suction vent hole
14: Discharge vent hole 20: Rack frame
30, 30a, 30b, 30c, 30d, 30e: First to sixth cooling units
31: Discharge port 32: Suction port
33: Fixed flange 34: Fixing hole
35, 35a: Case
36, 36b, 36c: First to third partitions
36a: Inclined portion 40: Suction duct
41: Discharge duct 42: Suction packing
43: Discharge packing 50: Evaporator
51: Discharge fan 52: Support plate
53: Through hole 54: Reservoir
55: Heater 56: Water level sensor
60: Compressor 61: Condenser
62: Discharge fan 63: Suction passage
64: Air discharge passage 70: Controller
a: Boundary
b, c, d, e: First to fourth regions

The invention claimed is:

1. A computing rack apparatus comprising:
a rack housing configured to store a server;
a rack frame disposed in the rack housing, the server being fastened to and mounted on the rack frame; and
a cooling unit disposed in the rack housing, the cooling unit comprising a discharge port configured to discharge cooling air and a suction port configured to suck internal air passing through a cooling zone, wherein:
the discharge port is located in a first region with respect to a boundary defined as a front surface of the server, and the suction port is located in a second region with respect to the boundary, the first and second regions forming the cooling zone,
the cooling unit includes a box-shaped case which is detachably mounted in the rack housing,
the box-shaped case comprises a third region containing a cooling means and a fourth region allowing external air to flow therethrough, the third region and the fourth region being divided by a partition, and
the rack housing comprises a plurality of suction vent holes formed in a front door and connected to a suction duct communicating with an air suction passage allowing the external air to be sucked therethrough and a plurality of discharge vent holes formed in a rear door and connected to a discharge duct communicating with an air discharge passage allowing the external air to be discharged therethrough.

2. The computing rack apparatus of claim 1, wherein the fourth region comprises the suction duct communicating with the air suction passage allowing the external air to be sucked therethrough and the discharge duct communicating with the air discharge passage allowing the external air to be discharged therethrough.

3. The computing rack apparatus of claim 1, wherein the third region contains a reservoir to store moisture.

4. The computing rack apparatus of claim 3, wherein the reservoir comprises a water level sensor and a heater.

5. The computing rack apparatus of claim 2, wherein a controller is mounted in the third region.

* * * * *